US005220183A

United States Patent [19]

Taniguchi et al.

[11] Patent Number: 5,220,183
[45] Date of Patent: Jun. 15, 1993

[54] THIN FILM EL PANEL WITH OPAQUE ELECTRODE

[75] Inventors: Kouji Taniguchi; Masaru Yoshida; Shigeo Nakajima, all of Nara, Japan

[73] Assignee: Sharp Kabushiki Kaisha, Osaka, Japan

[21] Appl. No.: 761,712

[22] Filed: Sep. 12, 1991

[30] Foreign Application Priority Data

Sep. 17, 1990 [JP] Japan ........ 2-248452

[51] Int. Cl.[5] ........ H01L 33/00

[52] U.S. Cl. ........ 257/88; 257/91; 257/93; 257/99; 257/763; 257/770; 359/87; 359/88; 359/54

[58] Field of Search ........ 357/17, 4, 45, 71, 71 S, 357/67 S; 359/53, 54, 87, 88

[56] References Cited

U.S. PATENT DOCUMENTS 4,523,811 6/1985 Ota ........ 357/71 X
4,543,573 9/1985 Fuyama et al. ........ 357/71 X

OTHER PUBLICATIONS

Dirks et al., "Al-Ti and Al-Ti-Si Thin Alloy Films", *J. Appl. Phys.* 59(6), Mar. 15, 1986, pp. 2010-2014.
Sequeda, "The Role of Thin Film Materials on the Technology of Integrated Circuit Fabrication," *Journal of Metals*, Nov. 1985, pp. 54-59.
Ho, "General Aspects of Barrier Layers For Very-Large-Scale Integration Applications I:Concepts," *Thin Solid Films*, 96 (1982), pp. 301-316.
Campbell et al, "Enhanced Polycide Structures," *IBM Technical Disclosure Bulletin*, vol. 25, No. 4, Sep. 1982, pp. 1920-1921.
Murarka et al., "Refractory Silicides of Titanium and Tantalum for Low-Resistivity Gates and Interconnects," *IEEE Journal of Solid-State Circuits*, vol. 5C-15, No. 4, Aug. 1980, pp. 474-481.

*Primary Examiner*—William Mintel

[57] ABSTRACT

A thin film EL panel emits its light in response to the application of an electric field so as to make it possible to correspondingly create a multi-color display. The display created is higher in light emission efficiency, lower in power consumption, higher in function and higher in quality with the electrodes being sufficient in a heat resisting property with respect to the main thermal process.

25 Claims, 3 Drawing Sheets

THIN FILM EL PANEL WITH OPAQUE ELECTRODE

BACKGROUND OF THE INVENTION

The present invention generally relates to a thin film EL panel which is adapted to emit its light in response to the application of an electric field so as to make it possible to correspondingly display multicolor.

Conventionally a thin film EL panel is constructed as shown in FIG. 6. The thin film EL panel has a transparent electrode 62, an insulating layer 63, a light emitting layer 64, an insulating layer 65, and a transparent electrode, 66 on the rear face side, respectively formed on a glass base plate 61. As a transparent electrode 62 has higher melting point than 660° C., the above described transparent electrode 62 can endure the thermal process in the above described forming step. In order to avoid heat to be caused in the manufacturing process, a color filter 67 which has a pattern corresponding to the picture element in a region with the above described transparent electrode 62 and the transparent electrode 66 on the rear face side being opposed is formed on a color filter forming base plate 68 provided above the transparent electrode 66 on the above described rear face side. Upon the application of the field between the above described transparent electrode 62 and the transparent electrode 66 on the rear face side, the above described thin film EL panel emits its light in the above described light emitting layer 64. The above described thin film EL panel transmits through a color filter, the light to be generated by the above described light emitting layer 64 so as to display multicolor.

Another thin film EL panel is provided with an Al electrode, instead of a transparent electrode 62 as described in the above-mentioned thin film EL panel shown in FIG. 6.

The former thin film EL panel has problems in that the electrode is formed as an electrode closer to the glass base plate 61 having a melting point higher than 660° C. Further, resistance and consumption power of the transparent electrode 62 are larger, respectively. The thin film EL panel is formed on the rear side from the side where the light is taken out, and thus is not required to be transparent. Further, as the above described transparent electrode 62 is transparent as an electrode closer to the base plate which is an electrode desired to be higher in the reflection factor of the light, the reflection factor of the light of the transparent electrode 62 is lower, and the light takeout efficiency becomes lower. As compared with a case of using the Al electrode, the light emitting efficiency becomes approximately half as low, which is a problem.

When a light emitting layer is generally formed by an electronic beam evaporating method in the manufacturing step of the thin film EL panel, the thermal treatment is affected at the temperatures of 550° C. or more after the formation of the light emitting layer. When the light emitting layer is formed by a CVD (chemical.vapor. deposition) method including ALE (atomic.layer-.epitaxy), the temperature of the base plate becomes 500° or more. The thermal process in these manufacturing steps is unavoidable so as to obtain the light emission efficiency for practical use. The electrode close to the above described basic plate cannot avoid the influences of the thermal process in the manufacturing step of the insulating layer and the light emitting layer after the formation of the electrode.

As the above described Al electrode as an electrode closer to the base plate does not have a melting point higher than 660° C. in the thin film EL panel of the latter, there is a problem in that the above described Al electrode is deteriorated by the thermal process in the above described manufacturing step. Generally, the melting point of the Al is 660° C. In the case of Al of the thin film as in the Al electrode to be used in the thin film EL panel, the Al of the above described thin film is increased in the ratio of the surface energy so as to lower the melting point. The melting point of the Al electrode of the film thickness 1000 Å formed on, for example, the glass base plate becomes 630° C. or lower. When an insulating layer has been formed by a sputtering method on the above described Al electrode, the melting point of the above described Al electrode is further lowered. When the film thickness of the above described Al electrode has been made 5000A or more, the above described Al electrode can endure the thermal process of a temperature of 550° C. When the film thickness of the above described Al electrode, which is an electrode in the ground work closer to the glass base plate, becomes thicker in the thin film EL panel, problems such as insulating destruction and so on are caused due to the pattern edge of the Al electrode. This therefore makes it difficult to make the film of the above described Al thicker. Also, as the above described Al electrode is likely to cause havoc even in the comparatively cold temperature of the melting point or lower of the Al electrode, there is a problem in that it is difficult to retain a high quality light emission while maintaining the flatness property of the above described Al electrode. Further, as the oxidizing force of the Al is strong, there is a problem in that the above described Al electrode and the parts to come into contact with the above described Al electrode are likely to be chemically deteriorated. Thus, the high quality of light emission becomes difficult to keep.

SUMMARY OF THE INVENTION

Accordingly, the present invention has been developed with a view to substantially eliminating the above discussed drawbacks inherent in the prior art and has for its essential object to provide an improved thin film EL panel.

Another important object of the present invention is to provide an improved thin film EL panel which is higher in light emission efficiency, lower in power consumption, higher in function and higher in quality with only the electrode being sufficient in heat resisting property with respect to the above described thermal process. A further object is to provide an improved thin film EL panel which is formed of a material quality which has a good flatness property and chemical stability with a high reflection factor and a lower electric resistance, upon consideration of an electrode which is closer to a base plate where the influences of the thermal process in the manufacturing step is unavoidable.

In accomplishing these and other objects, according to one preferred embodiment of the present invention, there is provided a thin film EL panel which is provided with a light emitting layer sandwiched by two electrodes on a base plate, and which is characterized in that an electrode closer to the above described base plate from between the above described two electrodes has an opaque portion of at least one from a higher melting point metal such as Ti, Ni, Cr, Ta, Mo, W, Ag, Cu or the like each having a melting point exceeding 660° C., a higher melting point alloy such as Ti-Al, Al-Ce, Al-Ni, Fe-Ni-Cr or the like or silicide such as $WSi_2$, $MoSi_2$, $CoSi_2$, $TiSi_2$ or the like.

Also, it is desired that an insulting layer composed of nitride be adhered on the face on the side opposite at least the above described light emitting layer of the electrode closer to the above described base plate.

Also, it is desired that an electrode closer to the above described base plate arrange the above described opaque portion and the transparent portion on the same face.

Since the electrode closer to the base plate has an opaque portion composed of at least one from a higher melting point metal each having a melting portion exceeding 660° C, a higher melting point alloy or silicide, an electrode closer to the above described basis plate has a sufficient heat resistant property with respect to the thermal process in the manufacturing step, and also, is higher in reflection factor and smaller in electric resistance.

When the insulating layer composed of nitride has been adhered on the face on the side opposite to at least the light emitting layer of an electrode closer to the above described base plate, the oxidation-reduction reaction of the electrode closer to the above described base plate is controlled, increase in the electric resistance due to the deterioration in the above described electrode, electrode disconnection and blackening are controlled. In this case, the restriction with respect to the selection in the material of the above described electrode becomes relaxed, and the selection width of the material to be used in the above described electrode becomes larger upon the consideration that the size relation between the standard free energies of the material of the above described electrode and the standard free energies of the oxide thin film material of the above described light emitting layer so that the oxidation-reduction reaction of the above described electrode may be controlled.

When the above described opaque portion and the transparent portion are disposed on the same face, an electrode closer to the above described base plate may take out the light, to be generated by the light emitting layer, onto the base plate side.

BRIEF DESCRIPTION OF THE DRAWINGS

These and other objects and features of the present invention will become apparent from the following description taken in conjunction with the preferred embodiment thereof with reference to the accompanying drawings, in which.

DETAILED DESCRIPTION OF THE INVENTION

Figure 1:
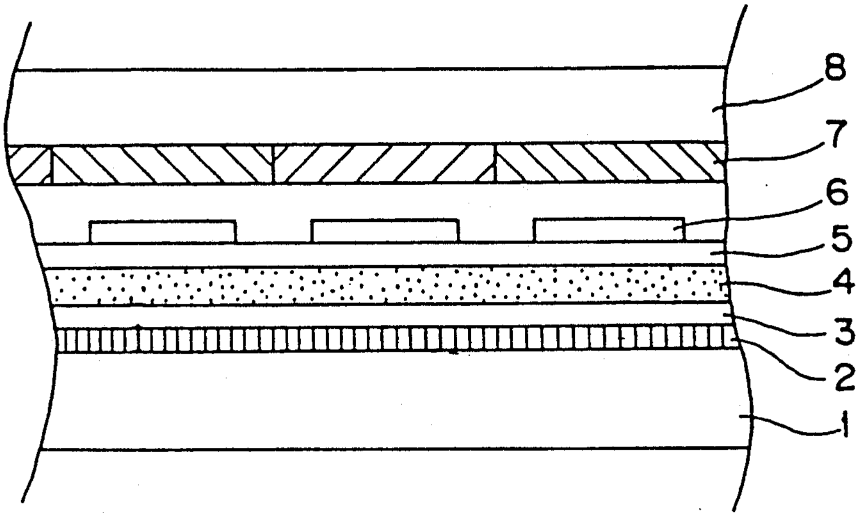
FIG. 1 is a sectional view in a first embodiment of a thin film EL, panel of the present invention.

Before the description of the present invention proceeds, it is to be noted that like parts are designated by like reference numerals throughout the accompanying drawings.

The present invention will be described in detail hereinafter with reference to the illustrated embodiments.

FIG. 1 is a sectional view of a thin film EL panel in a first embodiment. The thin film EL panel has an opaque electrode 2 composed of Ti-Al alloy film as a higher melting point alloy, and an insulating layer 3 composed of $SiO_2$ and $Si_3N_4$, a light emitting layer 4, an insulating layer 5 composed of $Si_3N_4$ and $Al_2O_3$, and a transparent electrode 6 composed of ITO film formed in order on the glass base plate 1. The film thickness of Ti-Al alloy film which is the above described opaque electrode 2 is 500 through 5000 Å and the film thickness of ITO (tin added indium oxide) film which is the above described transparent electrode 6 is 1500 through 5000 Å. The above described opaque electrode 2 and transparent electrode 6 are patterned into a mutually orthogonal stripe shape by photo-lithography with the use of normal wet etching. The melting point of the above described opaque electrode 2 may be made 340° C. or more by the composition of the Ti-Al alloy film which is the above described opaque electrode 2 on Ti rich side from the $TiAl_3$ or $TiAl_3$. The above described opaque electrode 2 can sufficiently endure the thermal process in the manufacturing step of the above described thin film EL panel. As the opaque electrode 2 composed of the above described Ti-Al alloy film is higher in reflection factor in visible light, and less in electric resistance than the transparent electrode composed of ITO film, the light emitting efficiency can be improved and the consumption power may be saved. The opaque electrode 2 composed of the above described Ti-Al alloy film can be patterned with the use of the known Al etching liquid, thus being superior in the practical use in the manufacturing operation. In order to avoid the heat to be generated in the manufacturing process, the above described thin film EL panel forms on a color film forming base plate 8 provided above the above described transparent electrode 6 a color filter 7 having a pattern corresponding to the picture element in a region where the above described transparent electrode 6 is opposed to the opaque electrode 2. The above described thin film EL panel applies the field between the above described transparent electrode 6 and the opaque electrode 2 to make the above described light emitting layer 4 emit its light. The panel can display the multi-color with the use of the above described color filter 7. As there is no layer to be adhered on the above described transparent electrode 6, a problem of the insulation destruction at the electrode pattern edge is not caused, so that the electric resistance may be made smaller with the the film thickness of the above described transparent electrode 6 being set thicker. Accordingly, the power consumption of the above described thin film EL panel may be made smaller.

Although a Ti-Al alloy is used as a high melting point alloy which becomes an opaque electrode to be formed on the glass base plate 1 in the above described embodiment, Al-Ce alloy, Al-Ni alloy, Fe-Ni-Cr alloy or the like may be used as the above described high melting point alloy.

Figure 2:
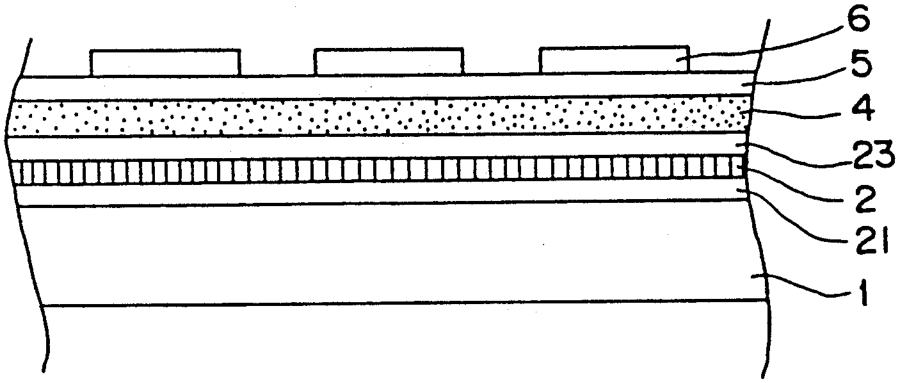
FIG. 2 is a sectional view in a second embodiment of the present invention.

A second embodiment is shown in FIG. 2. In the present embodiment, an insulating layer 23 composed of nitride $Si_3N_4$, instead of an insulating layer 3 composed of $SiO_2$ and $Si_3N_4$ in the above described first embodiment. An insulating layer 21 composed of nitride $Si_3N_4$ is formed between the glass base plate 1 and the opaque electrode 2. The difference in the second embodiment from the above described first embodiment is only in that the color filter and the base plate 8 for forming the color filter are not formed. The same numerals as those of the portions shown in FIG. 1 are given to the same portions as those in the above described first embodiment. The portions different from those in the first embodiment will be chiefly described hereinafter.

As shown in FIG. 2, in the present embodiment, the opaque electrode 2 composed of Ti-Al alloy film is inserted between the insulating layers 21 and 23 composed of nitride $Si_3N_4$. At the thermal process time in the manufacturing step, the above described opaque electrode 2 is prevented from being deteriorated due to the chemical reaction, the addition in the electric resistance of the above described opaque electrode 2, electrode disconnection and blackening may be prevented, and the display quality and the display function may be improved.

In the present embodiment, $Si_3N_4$, was used as nitride to be used in the insulating layer, but nitride such as AlN or the like may be used as the above described nitride. In the present embodiment, insulating layers 21 and 23 composed of nitride $Si_3N_4$ surrounding the top and bottom of the opaque electrode 2 was provided. Even when the insulating layer composed of nitride $Si_3N_4$ is provided only in the top side of the opaque electrode 2, the deterioration of the above described opaque electrode 2 may be prevented by the temperature of the thermal process in the manufacturing step and the process time. Also, the above described insulating layer may be a nitride insulating layer of layered construction with the oxide being formed on the nitride.

A third embodiment will be shown hereinafter in FIG. 3. An opaque electrode 32 of two layer construction composed with Ti film 30 and Cr film 31 composed of high flexible point metal being formed in order is formed, instead of an opaque electrode 2 composed of Ti-Al alloy film in the above described first embodiment. An insulating layer 33 composed of nitride $Si_3N_4$:O including some oxygen, instead of an insulating layer 3 composed of $SiO_2$ and $Si_3N_4$ are formed. The third embodiment is-different from the above described first embodiment in that a color filter 7 and a color filter forming base plate 8 are not formed. Therefore, the same numerals as those of the portions shown in FIG. 1 are given to the same portions in the first embodiment. The portions different from those of the first embodiment will be chiefly described hereinafter.

Figure 3:
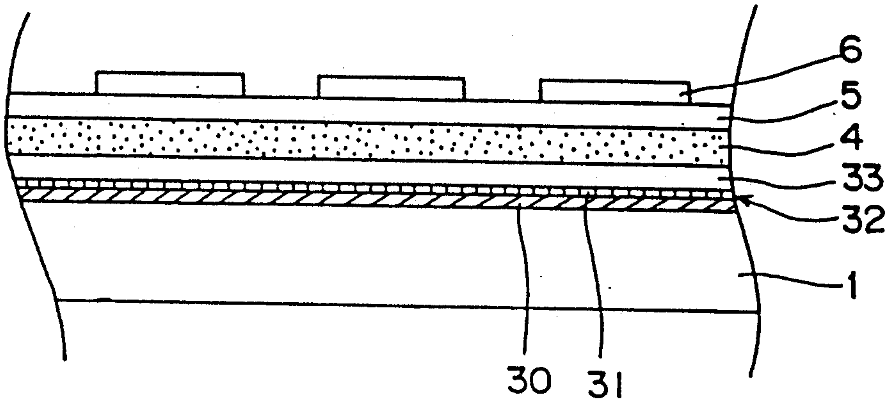
FIG. 3 is a sectional view in a third embodiment of the present invention.

As shown in FIG. 3, an opaque electrode 32 of two layer construction with Ti film 30 composed of high melting point metal and Cr film 31 composed of high melting point metal being formed in order on the glass base plate 1 is formed. The above described Ti film 30 is stronger in oxidation force than $SiO_2$ which is the major component of the glass base plate 1, and the above described Cr film 31 is weaker in oxidation force than oxygen, namely, $SiO_2$ including the nitride $Si_3N_4$:O. Since the above described Cr film 31 is hard to oxidize even when an insulating layer to be formed on the Cr film 31 includes some oxygen, the adherence property between the above described opaque electrode 32 and the insulating layer 33 including some oxygen may be improved. As the above described Cr film 31 is higher in the reflection factor of light, the thin film EL panel having the superior heat resisting property and the higher light emitting efficiency may be realized without the use of insulating film composed of $Si_3N_4$ film which does not include oxygen, is hard to produce.

Although Cr is used as a high melting point metal which is weaker in oxidizing power than $SiO_2$, stainless steel of Ni, Fe, instead of Cr, or of an alloy of Cr, Ni and Fe may be used. In the present embodiment, nitrogen $Si_3N_4$:O including some oxygen was as an insulating layer 33, $SiO_2/Si_3N_4$ may be used as an insulating layer 33, depending upon the temperature of the thermal process in the manufacturing step.

A fourth embodiment will be shown hereinafter in FIG. 4. The embodiment is a thin film EL panel which has a second thin film EL panel, with a filter 7 and a base plate 8 for forming the color filter not being formed on it, disposed in opposite connection. In the above described first embodiment, a first thin film EL panel which does not have a filter 7 and a base plate 8 for forming the color filter formed, and a transparent electrode 42 composed of ITO film, instead of an opaque electrode 2 composed of Ti-Al alloy film in the above described first embodiment, are used. Therefore, the same reference numerals as those in the portions in FIG. 1 are given to the same portions in the fourth embodiment as those in the above described first embodiment. The fourth embodiment will be described in the portions different from those in the first embodiment.

Figure 4:
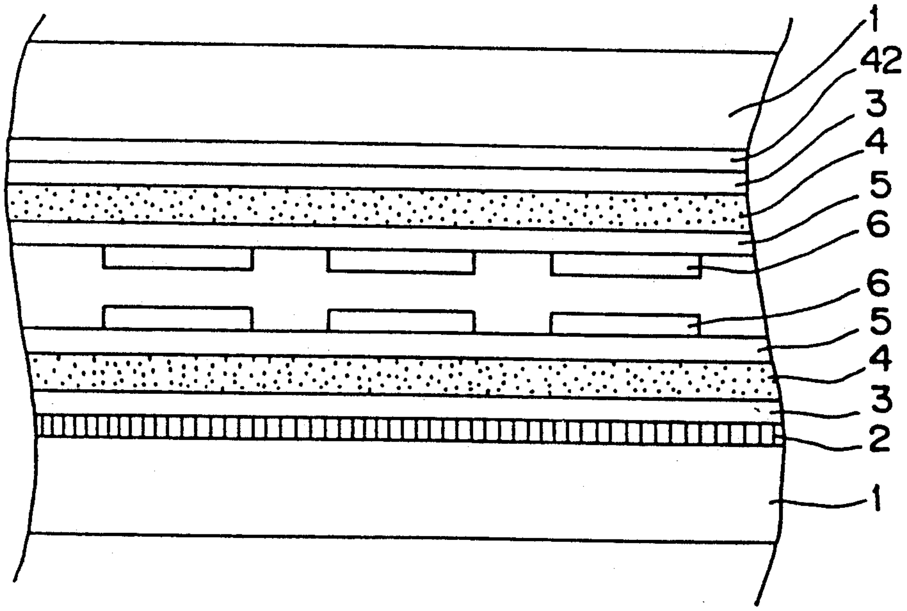
FIG. 4 is a sectional view in a fourth embodiment of the present invention.

As shown in FIG. 4, the thin film EL panel in the present embodiment is adapted to take out the light to be generated by two light emitting layers 4, 4 onto the side of the glass base plate 1 of the upper second thin film EL panel with two thin film EL panels being arranged in opposite relation. Since the present embodiment has a first thin film EL panel of the higher light emitting efficiency and the lower consumption power, the light emitting efficiency of the thin film EL panel which is composed of two thin film EL panels combined may be made higher and also, the consumption power may be made smaller.

A fifth embodiment will be shown hereinafter in FIG. 5. The fifth embodiment is different from the fourth embodiment only in that an electrode 52 is formed with a transparent portion 50 composed of ITO film and an opaque portion 51 composed of Ti which is high melting point metal being arranged in the same face, instead of a transparent electrode 42 composed of ITO film of the upper second thin film EL panel in the above described fourth embodiment. Accordingly, the same reference numerals as those shown in FIG. 4 are given to the same portions in FIG. 5 as those in the above described fourth embodiment. The portions different from portions in the fourth embodiment will be mainly described hereinafter.

Figure 5:
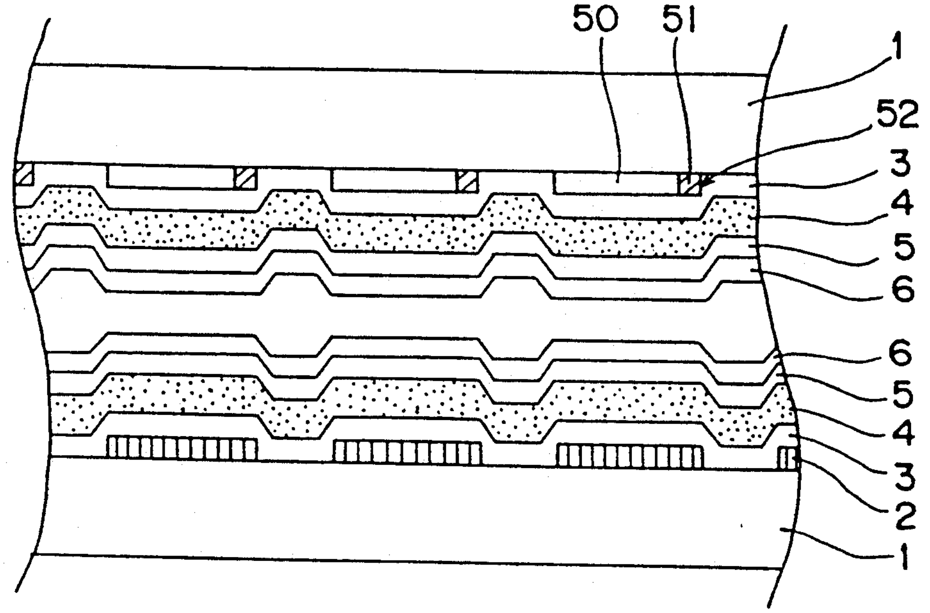
FIG. 5 is a sectional view in a fifth embodiment of the present invention.
Figure 6:
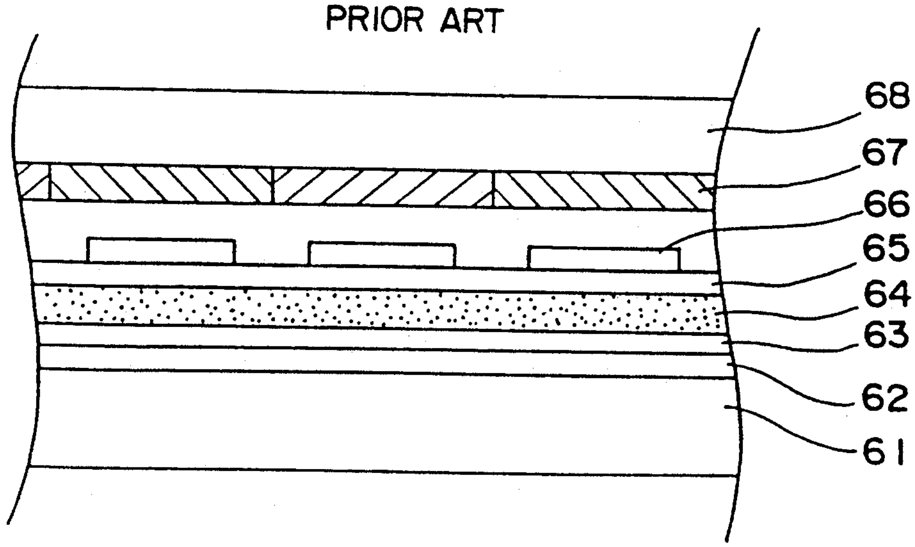
Fig. 6 PRIOR ART
FIG. 6 is a sectional view of the conventional thin film EL panel.

As described in FIG. 5, in the present embodiment, an electrode 52 with a transparent portion 50 composed of ITO film, an opaque portion 51 composed of Ti with approximately one tenth or less of the stripe of the above described transparent portion 50 being a stripe width is disposed on the same face in the upper second thin film EL panel. Therefore, the light emitting layer 4 of the upper second thin film EL panel generates may be taken out onto the side of the glass base plate 1 through a transparent portion composed of the above described ITO film, and the electric resistance of the above described electrode 52 may be made smaller with the opaque portion 51 composed of the above described Ti. According to the present embodiment, the consumption power of the thin film EL panel composed of two thin films being combined may be saved in particular. In order to avoid the oxidization of the opaque portion 51 composed of Ti, the above described electrode 52 is formed in the order of the transparent portion 50, the opaque portion 51. The thermal treatment for the low resistance of the transparent portion 50 composed of the above described ITO film is desired to be effected before the above described opaque portion 51 is formed. In the present embodiment, Ti was used as a high melting point metal composing the opaque portion 51 of the electrode 52, Ni, Cr, Ta, Mo, W, Ag, Cu or the like, instead of Ti, may be used.

As is clear from the foregoing description, according to the arrangement of the present invention, the thin film EL panel of the preset invention has an opaque portion composed of at least one of high melting point metal, high melting point alloy or silicide each having a melting point exceeding 660° C. in an electrode closer to the base plate upon which the thermal burden is applied at the manufacturing time. An electrode closer to the above described base plate has a heat resisting property sufficient with respect to the thermal process in the manufacturing step, is higher in the reflection factor, and is smaller in electric resistance. According to the present invention, a higher thin film forming process temperature for obtaining the light emitting efficiency for practical use may be applied, and also, a thin film EL panel which is higher in light emitting efficiency, higher in function of low consumption power, and higher in quality may be realized.

When an insulating layer composed of a nitride has been adhered on the face on the side opposite to at least the light emitting layer of the electrode which is closer to the above described base plate, the oxidation-reduction reaction of the electrode closer to the above described base plate may be controlled, and the increase in the electric resistance due to the deterioration of the above described electrode, the electrode disconnection and the blackening of the above described electrode may be controlled, thus realizing a thin film EL panel which is higher at function and higher in quality. In this case, the restriction with respect to the selection in the material of the above described electrode may be relaxed, and the selection width of the material to be used in the above described electrode may be made wider upon consideration of the size relation between the standard free energies of the material of the above described electrode and the standard free energies of the oxide thin film material of the above described light emitting layer so that the oxidation-reduction reaction of the above described electrode may be controlled.

When the above described opaque portion and the transparent portion are disposed on the same face, the electrode closer to the above described base plate may be take out of the light to be generated by the light emitting layer onto the base plate side.

Although the present invention has been fully described by way of example with reference to the accompanying drawings, it is to be noted here that various changes and modifications will be apparent to those skilled in the art. Therefore, unless such changes and modifications otherwise depart from the scope of the present invention, they should be construed as included therein.

What is claimed is:

1. A thin film EL panel comprising:

a base plate;

a light emitting layer surrounded above and beneath by two electrodes, formed above the base plate, one of the electrodes being formed on the base plate and being formed of an opaque material selected from the group consisting of a metal, a metal alloy, and a silicide, each having a melting point exceeding 660° C.

2. The thin film EL panel of claim 1, wherein an insulating layer composed of a nitride is formed between the light emitting layer and the electrode with the opaque material, closer to the base plate.

3. A thin film EL panel comprising:

a base plate;

a light emitting layer surrounded above and beneath by two electrodes, formed above the base plate, one of the electrodes being formed on the base plate and being formed of an opaque metal selected from a group consisting of Ti, Ni, Cr, Ta, Mo, W, Ag, Cu, each having a melting point exceeding 660° C., an alloy selected from a group consisting of Ti-Al, Al-Ce, Al-Ni, and Fe-Ni-Cr, each having a melting point exceeding 660, and a silicide selected from a group consisting of $WSi_2$, $MoSi_2$, $CoSi_2$, $TiSi_2$, each having a melting point exceeding 660° C.

4. A thin film electroluminescent panel comprising:

a base plate;

an opaque electrode, including at least one of a metal, a metal alloy, and a silicide, having a melting point exceeding 660° C. and formed on the base plate; and a transparent electrode formed above a light emitting layer.

5. The thin film electroluminescent panel of claim 4, further comprising:

a first insulating layer formed between the light emitting layer and the opaque electrode; and a second insulating layer formed between the light emitting layer and the transparent electrode.

6. The thin film electroluminescent panel of claim 4, wherein the opaque electrode is made from a titanium (Ti)-aluminum (Al) alloy.

7. The thin film electroluminescent panel of claim 4, wherein the opaque electrode is made from an alloy selected from the group consisting of aluminum (Al)-Cerium (Ce) alloy, aluminum (Al)-nickel (Ni) alloy, and Iron (Fe)-Nickel (Ni)-Chromium (Cr) alloy.

8. The thin film electroluminescent panel of claim 5, wherein the first insulating layer includes silicon nitride ($Si_3N_4$) and silicon dioxide ($SiO)_2$), and the second insulating layer includes $Si_3N_4$ and aluminum oxide ($Al_2O_3$).

9. The thin film electroluminescent panel of claim 4, wherein the opaque electrode includes a first opaque layer formed on the base plate and a second opaque layer formed on the first opaque layer.

10. The thin film electroluminescent panel of claim 9, wherein the first opaque layer includes titanium (Ti) and the second opaque layer includes a material selected from the group consisting of chromium (Cr), nickel (Ni), iron (Fe), an Ni alloy, a Cr alloy, and an Fe alloy.

11. A thin film electroluminescent panel comprising:

a first layer including,
  a base plate,
  an opaque electrode, including at least one of a metal, a metal alloy, and a silicide, having a melting point exceeding 660° C. and formed on the base plate,
  a first light emitting layer formed above the opaque electrode, and
  a first transparent electrode formed above the first light emitting layer in a direction perpendicular to the opaque electrode; and
a second layer, formed so as to oppose the first layer, including,
  a second base plate,
  a second transparent electrode formed on the second base plate in a direction parallel to the opaque electrode,
  a second light emitting layer formed below the second light emitting layer in a direction perpendicular to the opaque electrode.

12. The thin film electroluminescent panel of claim 11, wherein the second layer includes an opaque electrode portion connected to the second transparent electrode and formed on the second base plate.

13. The thin film electroluminescent panel of claim 12, wherein the opaque electrode portion is formed of a material selected from the group consisting of titanium (Ti), nickel (ni), chromium (Cr), tantalum (Ta), molybdenum (Mo), tungsten (W), silver (Ag) and copper (Cu).

14. The thin film electroluminescent panel comprising:
  a base plate;
  a first insulating layer including silicon nitride ($Si_3N_4$), formed on the base plate;
  an opaque electrode, including at least one of a metal, a metal alloy, and a silicide, having a melting point exceeding 660° C. and formed on the first insulating layer;
  a second insulating layer, including $Si_3N_4$ and formed on the opaque electrode;
  a light emitting layer formed on the second insulating layer;
  a third insulating layer formed on the light emitting layer; and
  a transparent electrode formed on the third insulating layer.

15. The thin film electroluminescent panel of claim 14, wherein each insulating layer is formed of $SI_3N_4$.

16. A thin film EL panel comprising:
  a base plate on which a first electrode, a first insulating layer, a light emitting layer, a second insulating layer and a second electrode are sequentially mounted, the first electrode being formed of opaque materials and having a melting point exceeding 660° C.

17. A thin film EL panel comprising:
  a pair of first and second EL panels, each including a base plate on which a first electrode, a first insulating layer, a light emitting layer, a second insulating layer and a second electrode are sequentially mounted, the first and second EL panels being provided so as to face each other, with the second electrode of the first EL panel being formed of opaque material having a melting point exceeding 660° C.

18. The thin film EL panel of claim 16 or 17, wherein the first insulating layer consists essentially of nitride.

19. The thin film EL panel of claim 16 or 17, wherein the opaque material is selected from the group consisting of a metal, an alloy and a silicide.

20. The thin film EL panel of claim 19, wherein the metal is selected from the group consisting of Ti, Ni, Cr, Ta, Mo, W, Ag and Cu.

21. The thin film EL panel of claim 19, wherein the alloy is selected from the group consisting of Ti-Al, Al-Ce, Al-Ni and Fe-Ni-Cr.

22. The thin film EL panel of claim 19, wherein the silicide is selected from the group consisting of $WSi_2$, $MoSi_2$, $CoSi_2$ and $TiSi_2$.

23. The thin film EL panel of claim 18, wherein the nitride is one of a nitride of silicon and a nitride of aluminum.

24. The thin film EL panel of claim 16 or 17, wherein the first electrode is formed of an integrated thin film consisting of a first layer and a second layer, the first layer being a Ti thin film and the second layer consists of one selected from the group of Cr, Ni, Fe and Fe-Cr-Ni.

25. The thin film EL panel of claim 17, wherein the first electrode of the second EL panel includes an opaque portion formed of opaque materials having a melting point exceeding 660° C.

* * * * *